United States Patent
Torii et al.

(10) Patent No.: US 10,511,267 B2
(45) Date of Patent: Dec. 17, 2019

(54) POWER AMPLIFIER

(71) Applicant: Mitsubishi Electric Corporation, Tokyo (JP)

(72) Inventors: Takuma Torii, Tokyo (JP); Koji Yamanaka, Tokyo (JP); Masaki Kono, Tokyo (JP); Junichi Udomoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/772,115

(22) PCT Filed: Dec. 8, 2015

(86) PCT No.: PCT/JP2015/084397
§ 371 (c)(1),
(2) Date: Apr. 30, 2018

(87) PCT Pub. No.: WO2017/098578
PCT Pub. Date: Jun. 15, 2017

(65) Prior Publication Data
US 2018/0316315 A1    Nov. 1, 2018

(51) Int. Cl.
*H03F 3/16*    (2006.01)
*H03F 1/26*    (2006.01)
*H03F 1/32*    (2006.01)
*H03F 3/185*   (2006.01)
*H03F 3/21*    (2006.01)
*H01L 23/00*   (2006.01)
*H03F 1/02*    (2006.01)
*H03F 3/195*   (2006.01)
*H03F 3/24*    (2006.01)

(52) U.S. Cl.
CPC ............... *H03F 1/26* (2013.01); *H01L 23/00* (2013.01); *H03F 1/0205* (2013.01); *H03F 1/32* (2013.01); *H03F 1/3205* (2013.01); *H03F 3/185* (2013.01); *H03F 3/195* (2013.01); *H03F 3/211* (2013.01); *H03F 3/245* (2013.01)

(58) Field of Classification Search
CPC . H03F 3/72; H03F 3/211; H03F 3/189; H03F 3/68; H03F 3/601; H03F 2200/372; H03F 2200/294
USPC .................................. 330/277, 307, 295, 286
See application file for complete search history.

(56) References Cited

U.S. PATENT DOCUMENTS 5,546,049 A * 8/1996 Wen ........................ H01L 23/66
330/277
2008/0094141 A1    4/2008 Gotou et al.

FOREIGN PATENT DOCUMENTS

| JP | H06-151471 A | 5/1994 |
| JP | H11-251333 A | 9/1999 |
| JP | 2008-109227 A | 5/2008 |

\* cited by examiner

*Primary Examiner* — Khanh V Nguyen
*Assistant Examiner* — Khiem D Nguyen
(74) *Attorney, Agent, or Firm* — Studebaker & Brackett PC

(57) ABSTRACT

A multifinger transistor in which source fingers (201 to 206) and drain fingers (301 to 305) are arranged alternately with each of gate fingers (101 to 110) being sandwiched between one of the source fingers and one of the drain fingers is used. Line (10) and line (20) are attached to the source fingers (201 to 206) in an area on a gate side and causing a phase rotation such that the nearer to a central part a gate finger is, the more inductive the gate finger is.

5 Claims, 6 Drawing Sheets

POWER AMPLIFIER

TECHNICAL FIELD

The present invention relates to a power amplifier that operates with high efficiency.

BACKGROUND ART

In communication devices, radar devices, or the like, a power amplifier that amplifies the power of a transmission signal up to a desired level is mounted. In such a power amplifier, a semiconductor element such as a High Electron Mobility Transistor (HEMT) or a Field Effect Transistor (FET) is used.

The self-heating of a semiconductor element increases with increase in the power of a power amplifier. In order to reduce the performance degradation which is caused by the self-heating of a semiconductor element, an improvement in the efficiency is required in the power amplifier. As a method for improving the efficiency of the power amplifier, conventionally, a higher harmonic processing circuit is attached to a power amplifier, as shown in Patent Literature 1, for example. In this power amplifier, by disposing a higher harmonic processing circuit on an input side, the impedance for a second harmonic wave appearing at the gate terminal of a semiconductor element is short-circuited, and as a result, the voltage of a second harmonic wave appearing between the drain and the source of the semiconductor element is reduced to 0. As a result, the power loss in the higher harmonic wave is suppressed, and an improvement in the efficiency of the power amplifier is achieved.

CITATION LIST

Patent Literature

Patent Literature 1: Japanese Unexamined Patent Application Publication No. 2008-109227

SUMMARY OF INVENTION

Technical Problem

However, in such a conventional power amplifier, the following problem remains: in a case of using a multifinger transistor having multiple fingers in each cell as a semiconductor element, the voltage between the gate and the source at each gate finger differs from that at any other gate finger for a second harmonic wave because the distances from the higher harmonic processing circuit to the fingers differ from one another, and as a result, the improvement in efficiency for each finger due to the higher harmonic processing cannot be achieved enough.

The present invention is made in order to solve the above problem, and it is therefore an object of the present invention to provide a power amplifier that can achieve high efficiency.

Solution to Problem

According to the present invention, a power amplifier includes: a multifinger transistor which has a plurality of gate fingers, a plurality of source fingers, and a plurality of drain fingers, in which the plurality of source fingers and the plurality of drain fingers are arranged alternately, and each of the plurality of gate fingers is sandwiched between one of the plurality of source fingers and one of the plurality of drain fingers. The power amplifier includes a line attached to the plurality of source fingers in an area on a gate side and causing a phase rotation such that the nearer to a central part, being on a signal input end side, of the plurality of gate fingers a gate finger is, the more inductive the gate finger is.

Advantageous Effects of Invention

In a power amplifier according to the present invention, a line for causing a phase rotation such that the nearer to a central part of a plurality of gate fingers a gate finger is, the more inductive the gate finger is, is attached to the plurality of source fingers on a gate side.

DESCRIPTION OF EMBODIMENTS

Hereafter, for explaining the present invention in more detail, some embodiments of the present invention will be described with reference to the accompanying drawings.

Embodiment 1

Figure 1:
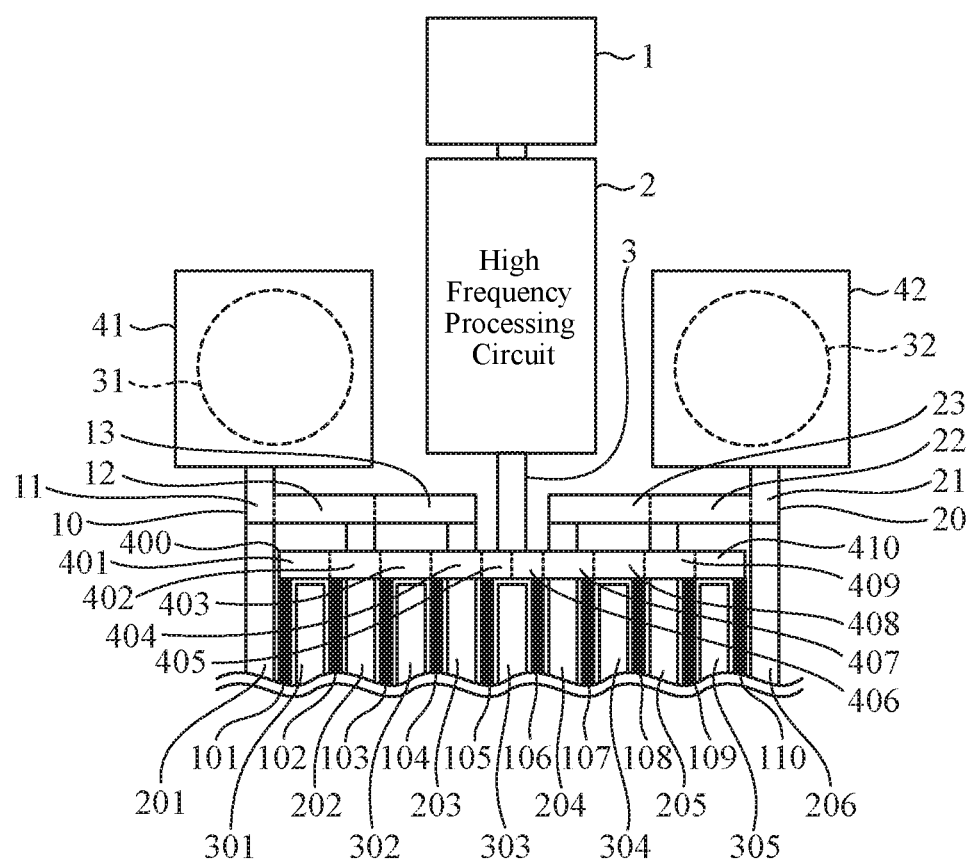
FIG. 1 is a schematic diagram of a power amplifier according to Embodiment 1 of the present invention.

FIG. 1 shows a pattern of a power amplifier according to this embodiment, and shows one cell of a multifinger transistor. The multifinger transistor means a transistor in which source fingers and drain fingers are arranged alternately in an active region on a semiconductor substrate, with each gate finger being sandwiched between a source finger and a drain finger, and the number of gate fingers is two or more.

The power amplifier shown in FIG. 1 includes an input terminal 1, a higher harmonic processing circuit 2, a transmission line 3, a line 10 consisting of lines 11, 12, and 13, a line 20 consisting of lines 21, 22, and 23, vias 31 and 32, via pads 41 and 42, gate fingers 101, 102, 103, 104, 105, 106, 107, 108, 109, and 110, source fingers 201, 202, 203, 204, 205, and 206, drain fingers 301, 302, 303, 304, and 305, and a gate feeder 400 consisting of lines 401, 402, 403, 404, 405, 406, 407, 408, 409, and 410. In FIG. 1, only the configuration of an input side of the power amplifier is shown, and the configuration of an output side of the power amplifier is not shown.

The input terminal 1 is connected to the higher harmonic processing circuit 2 and an RF signal is inputted thereto. The higher harmonic processing circuit 2 reflects a second harmonic wave appeared from a transistor, and is connected to the gate feeder 400 via the transmission line 3. For example, for the higher harmonic processing circuit 2, a transmission line, an inductor, a capacitor, and so on are used. The details of the higher harmonic processing circuit 2 will be described later. The gate fingers 101 to 110 are gate electrodes which form parts of the transistor, and are connected to the transmission line 3 through the gate feeder 400. The source fingers 201 to 203 are source electrodes which form parts of the transistor, and are connected to the via pad 41 through the line 10. The via pad 41 connects the line 10 and the via 31, and is grounded through the via 31. The source fingers 204 to 206 are source electrodes which form parts of the transistor, and are connected to the via pad 42 through the line 20. The via pad 42 connects the line 20 and the via 32, and is grounded through the via 32. The lines 10 and 20 compensate for a phase rotation which causes impedances on the gate fingers 101 to 110 being more inductive in the end parts of the gate feeder 400 than the central part thereof. Namely, the lines 10 and 20 cause a phase rotation to be more inductive in the central part of the gate fingers 101 to 110 than the end parts thereof, and are attached to the source fingers 201 to 206.

Figure 2:
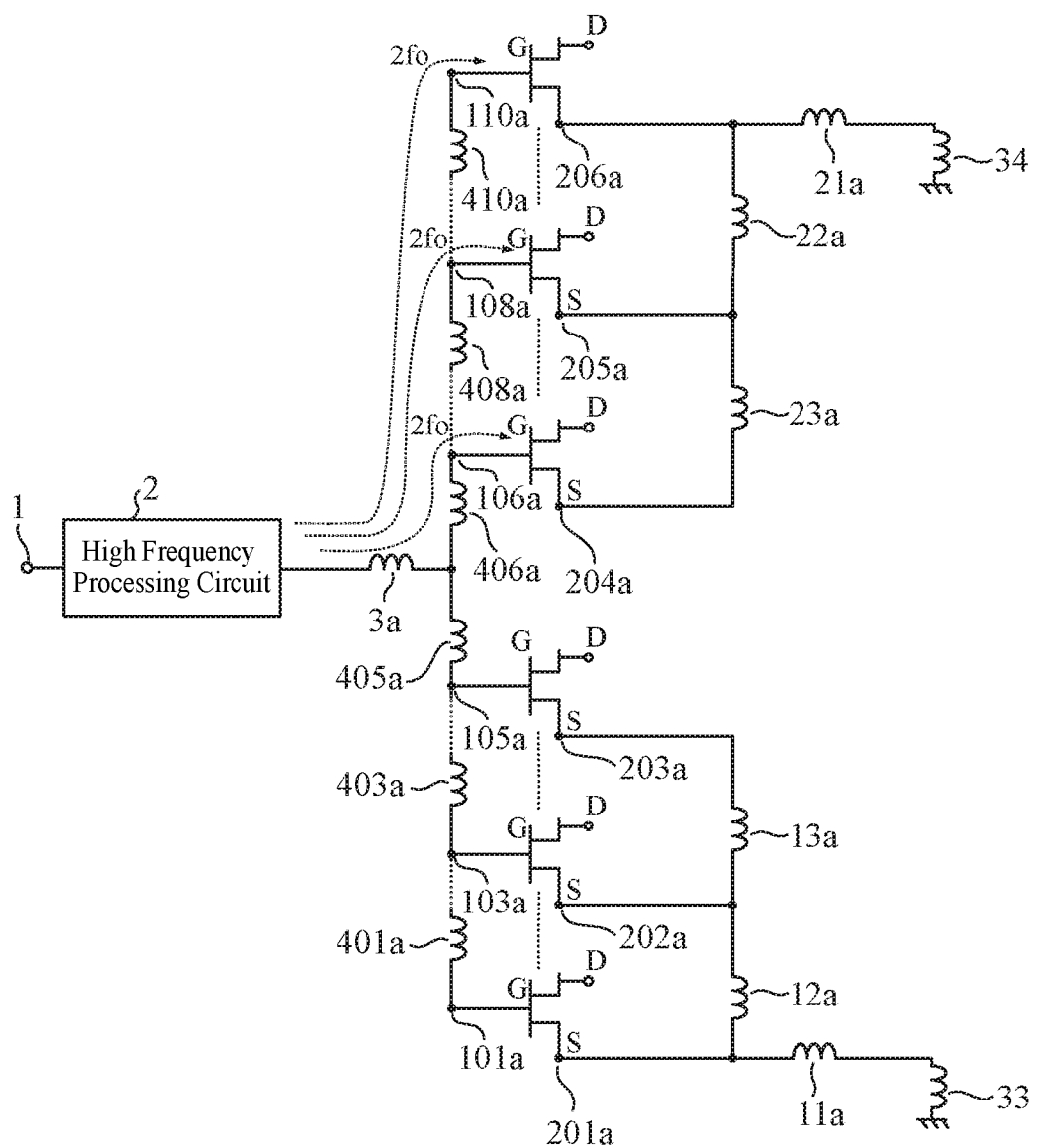
FIG. 2 is a diagram of an equivalent circuit of the power amplifier according to Embodiment 1 of the present invention.

FIG. 2 shows a diagram of an equivalent circuit of the power amplifier shown in FIG. 1. For simplifying the diagram, some parts of the configuration is not illustrated. Here, the configuration corresponding to one gate finger is grasped as one transistor, and the multifinger transistor shown in FIG. 1 is considered as an arrangement of a plurality of transistors. Each of reference signs shown in FIG. 2 denotes an equivalent circuit of the corresponding component (s) denoted by reference sign(s) shown in FIG. 1. Namely, an inductor 33 shown in FIG. 2 represents an equivalent inductor of the via pad 41 and the via 31, and an inductor 34 shown in FIG. 2 represents an equivalent inductor of the via pad 42 and the via 32. Further, an inductor 3a shown in FIG. 2 represents an equivalent inductor of the transmission line 3, inductors 11a to 13a and 21a to 23a represent equivalent inductors of the lines 11 to 13 and 21 to 23, and inductors 401a to 410a represent equivalent inductors of the lines 401 to 410. The inductances 402a, 404a, 407a, and 409a are not illustrated in FIG. 2.

A gate terminal 101a shown in FIG. 2 is a connection node between the gate finger 101 and the line 401, a gate terminal 103a is a connection node between the gate finger 103 and the line 403, a gate terminal 105a is a connection node between the gate finger 105 and the line 405, a gate terminal 106a is a connection node between the gate finger 106 and the line 406, a gate terminal 108a is a connection node between the gate finger 108 and the line 408, and a gate terminal 110a is a connection node between the gate finger 110 and the line 410.

A source terminal 201a shown in FIG. 2 is a connection node between the source finger 201 and the line 11, a source terminal 202a is a connection node between the source finger 202 and the line 12, a source terminal 203a is a connection node between the source finger 203 and the line 13, a source terminal 204a is a connection node between the source finger 204 and the line 23, a source terminal 205a is a connection node between the source finger 205 and the line 22, and a source terminal 206a is a connection node between the source finger 206 and the line 21.

Figure 3:
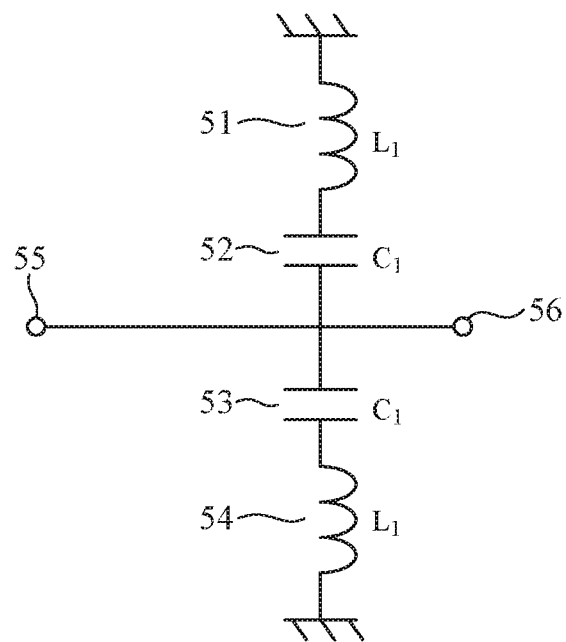
FIG. 3 is a circuit diagram showing an example of a higher harmonic processing circuit in the power amplifier according to Embodiment 1 of the present invention.

An example of a circuit diagram of the higher harmonic processing circuit 2 is shown in FIG. 3. The higher harmonic processing circuit 2 includes capacitors ($C_1$) 52 and 53, inductors ($L_1$) 51 and 54, and terminals 55 and 56. More specifically, both an end of a circuit including the capacitor 52 and the inductor 51 connected in series, and an end of a circuit including the capacitor 53 and the inductor 54 connected in series are connected to the terminals 55 and 56, and the other ends of these series circuits are grounded. The terminal 55 is connected to the input terminal 1, and the terminal 56 is connected to the transmission line 3.

Next, the operation of the power amplifier according to Embodiment 1 will be explained using the equivalent circuit shown in FIG. 2.

An RF signal which is a fundamental wave is inputted to the input terminal 1. The inputted signal reaches the gate feeder 400 via the higher harmonic processing circuit 2. The signal which has reached the gate feeder 400 is inputted to each of the transistors. When the signal which is a fundamental wave is inputted to each of the transistors, a second harmonic wave is generated because of the nonlinear parasitic capacitance between the gate and the source, and the generated second harmonic wave is reflected by the higher harmonic processing circuit 2.

The second harmonic wave reflected by the higher harmonic processing circuit 2 reaches each of the gate terminals 101a to 110a via the gate feeder 400. Because the distances from the higher harmonic processing circuit to the respective gate terminals 101a to 110a differ from one another, the phases of the voltages of the second harmonic waves at the gate terminals 101a to 110a differ from one another.

Hereafter, the operation of each of the transistors at a time when the second harmonic wave is reflected and inputted thereto will be explained.

Figure 4:
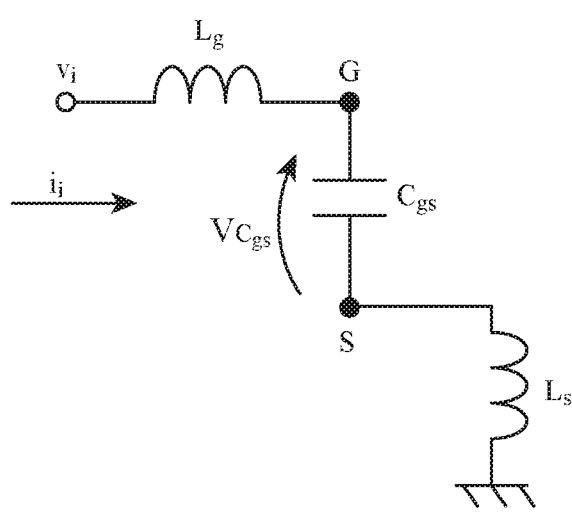
FIG. 4 is a diagram of an equivalent circuit of a transistor corresponding to each finger in the power amplifier according to Embodiment 1 of the present invention.

FIG. 4 shows an equivalent circuit of a transistor corresponding to one finger among the gate fingers 101 to 110. An equivalent inductor corresponding to a part of the gate feeder 400, the part extending from the connection node between the transmission line 3 and the gate feeder 400 to each of the gate fingers 101 to 110, is denoted by $L_g$, the parasitic capacitance between a gate finger and a source in each transistor is denoted by $C_{gs}$, an equivalent inductor corresponding to the line 10 (or 20) extending from the connection node of each of the source fingers 201 to 206 to the ground, the via pad 41 (or 42), and the via 31 (or 32) is denoted by $L_s$, the voltage amplitude of the inputted signal at the connection node between the transmission line 3 and the gate feeder 400 is denoted by $v_i$, the current flowing from the connection node between the transmission line 3 and the gate feeder 400 into each of the transistors is denoted by $i_i$, and the voltage difference between each of the gate fingers and a corresponding source finger is denoted by $v_{C_{gs}}$.

By making the values $v_{C_{gs}}$ at the respective gate fingers 101 to 110 be the same value which may be any value, processing on the second harmonic wave at each of the transistors formed by the gate fingers 101 to 110, respectively, can be optimized.

By using the voltage amplitude $v_i$ of an inputted signal, the current $i_i$ is expressed by the following equation (1).

$$i_i = \frac{v_i}{j\left(\omega L_g + \omega L_s - \frac{1}{\omega C_{gs}}\right)} \qquad (1)$$

By using the relationship given by the equation (1), the voltage difference $v_{C_{gs}}$ between a gate finger and a corresponding source finger is expressed by the following equation (2).

$$v_{Cgs} = \frac{v_i}{i_i} \cdot \frac{1}{j\omega C_{gs}} = \frac{v_i}{j\left(\omega L_g + \omega L_s - \frac{1}{\omega C_{gs}}\right)} \cdot \frac{1}{j\omega C_{gs}} \quad (2)$$

It is seen from the above equation (2) that $v_{Cgs}$ is a function which depends on $L_g$ and $L_s$. In order to make $v_{Cgs}$ at each of the fingers be the same value which may be any value, it is enough to make $(L_g+L_s)$ have a fixed value at each of the fingers.

For example, for the gate finger 101, L denotes the equivalent inductor corresponding to the inductors 401a, 402a, 403a, 404a, and 405a shown in FIG. 2 connected in series, and $L_s$ denotes the equivalent inductor corresponding to the inductors 11a and 33 shown in FIG. 2 connected in series. For the gate finger 103, $L_g$ denotes the equivalent inductor corresponding to the inductors 403a, 404a, and 405a shown in FIG. 2 connected in series, and $L_s$ denotes the equivalent inductor corresponding to the inductors 11a, 12a, and 33 shown in FIG. 2 connected in series.

As to $v_{Cgs}$ at the gate finger 101 and $v_{Cgs}$ at the gate finger 103, $L_g$ for the gate finger 101 is greater than $L_g$ for the gate finger 103 by the inductors 401a and 402a, while $L_s$ for the gate finger 101 is less than L for the gate finger 103 by the inductor 12a. Therefore, the difference in $v_{Cgs}$ between the gate fingers 101 and 103 which is caused by the inductors 401a and 402a is compensated for by the inductor 12a. In the same way, the difference in $v_{Cgs}$ between the gate fingers 103 and 105 which is caused by the inductors 403a and 404a is compensated for by the equivalent inductor 13a of the line 13. In the same way, the differences in $v_{Cgs}$ among the gate fingers 106, 108, and 110 which are caused by the inductors 407a to 410a are compensated for by the equivalent inductors 22a and 23a of the line 20.

In the case in which the lines 10 and 20 are formed to have a symmetric layout when viewed from the central part of the gate feeder 400 as shown in FIG. 1, the above-mentioned differences in $v_{Cgs}$ among the transistors are symmetrically compensated for by the lines 10 and 20. Consequently, variations in the electric potential differences and the phase differences among the gate-to-source voltages can be reduced as long as the voltage amplitudes at the transistors also have characteristics in which the voltage amplitudes are symmetric when viewed from the central part of the gate feeder 400. For example, in a case in which the higher harmonic processing circuit 2 is formed to have a symmetric layout when both the ends of the gate feeder 400 are viewed from the central part of the gate feeder 400, the amplitudes and phases of the voltages at the gate fingers 101 to 110 have electrical characteristics in which they are symmetric when both the ends of the gate feeder 400 are viewed from the central part of the gate feeder 400. When the amplitudes and phases of the voltages at the gate fingers 101 to 110 have characteristics in which they are symmetric when viewed from the central part of the gate feeder 400, the inductances of the equivalent inductors 401a and 410a are equal, the inductances of the equivalent inductors 402a and 409a are equal, the inductances of the equivalent inductors 403a and 408a are equal, the inductances of the equivalent inductors 404a and 407a are equal, and the inductances of the equivalent inductors 405a and 406a are equal. At this time, the values $L_g+L_s$ at the gate fingers 101 to 110, each of the values being given by the equation (2), are symmetric when viewed from the central part of the gate feeder 400, and the values $v_{Cgs}$ at the gate fingers 101 to 110 are also symmetric when viewed from the central part of the gate feeder 400.

The gate-to-source voltages of the second harmonic waves at the transistors have electrical characteristics in which the gate-to-source voltages are symmetric when viewed from the central part of the multifinger transistor, and as a result, the variations in the electric potential differences and the phase differences among the gate-to-source voltages of the transistors can be reduced.

When a signal is inputted to each of the transistors, the signal is amplified, and a drain voltage and a drain current appear at the drain terminal (not illustrated). Because the higher harmonic processing is applied at each of the transistors as described above, the drain voltage and the drain current at each of the transistors are shaped in such a way that the transistor operates in either the class F mode or the inverse class F mode. As a result, each of the transistors amplifies the power with high efficiency. The signals amplified by the transistors are synthesized in a drain feeder, and outputted from an output terminal (not illustrated).

Figure 5:
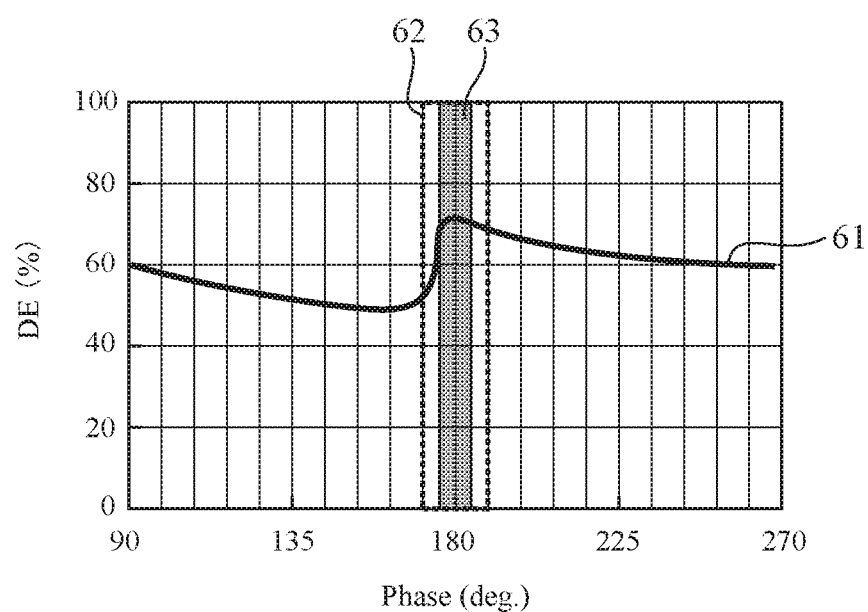
FIG. 5 is a graph for explanation showing a comparison between an effect provided by the power amplifier according to Embodiment 1 of the present invention and an effect provided by a conventional power amplifier.

FIG. 5 is a graph for explanation showing variations in the voltage phases among the gate fingers in comparison with those in a conventional device. In FIG. 5, the characteristics 61 shown by a solid line indicates a change in the efficiency (DE) of the transistor with respect to the voltage phase (Phase) at each of the gate fingers. Further, the dotted line frame 62 in FIG. 5 shows a range of variations in the voltage phases among the gate fingers in a case of using a conventional configuration, while the solid line frame 63 shows the variations in the voltage phases among the gate fingers in the case of using the configuration according to this embodiment. As shown in FIG. 5, it can be understood that the variations in the voltage phases are reduced in the power amplifier according to this embodiment.

As described above, in the power amplifier according to Embodiment 1, since the phase differences among the gate-to-source voltages of the second harmonic waves at the transistors are compensated for by the source inductors, optimal higher harmonics processing can be performed at each of the transistors.

As described above, the power amplifier according to Embodiment 1 includes a multifinger transistor which has a plurality of gate fingers, a plurality of source fingers, and a plurality of drain fingers, in which the plurality of source fingers and the plurality of drain fingers are arranged alternately, and each of the plurality of gate fingers is sandwiched between one of the plurality of source fingers and one of the plurality of drain fingers. The power amplifier includes a line attached to the plurality of source fingers in an area on a gate side and causing a phase rotation such that the nearer to a central part, being on a signal input end side, of the plurality of gate fingers a gate finger is, the more inductive the gate finger is. As a result, an improvement in the efficiency of the power amplifier can be achieved.

Further, in the power amplifier according to Embodiment 1, the power amplifier further includes a higher harmonic processing circuit, having a symmetric layout when both ends of the plurality of gate fingers are viewed from a central part of the plurality of gate fingers, being attached to a central part of a gate feeder, connecting the plurality of gate fingers, as the signal input end. As a result, an improvement in the efficiency of the power amplifier can be achieved.

Further, in the power amplifier according to Embodiment 1, the multifinger transistor is formed to have a symmetric layout when both the ends of the gate feeder connecting the plurality of gate fingers are viewed from the central part of the gate feeder. As a result, an improvement in the efficiency of the power amplifier can be achieved.

Embodiment 2

In Embodiment 1, a higher harmonic processing circuit is provided only to the gate side. However, a higher harmonic processing circuit can also be disposed on the drain side, and this configuration will be explained below as Embodiment 2.

Figure 6:
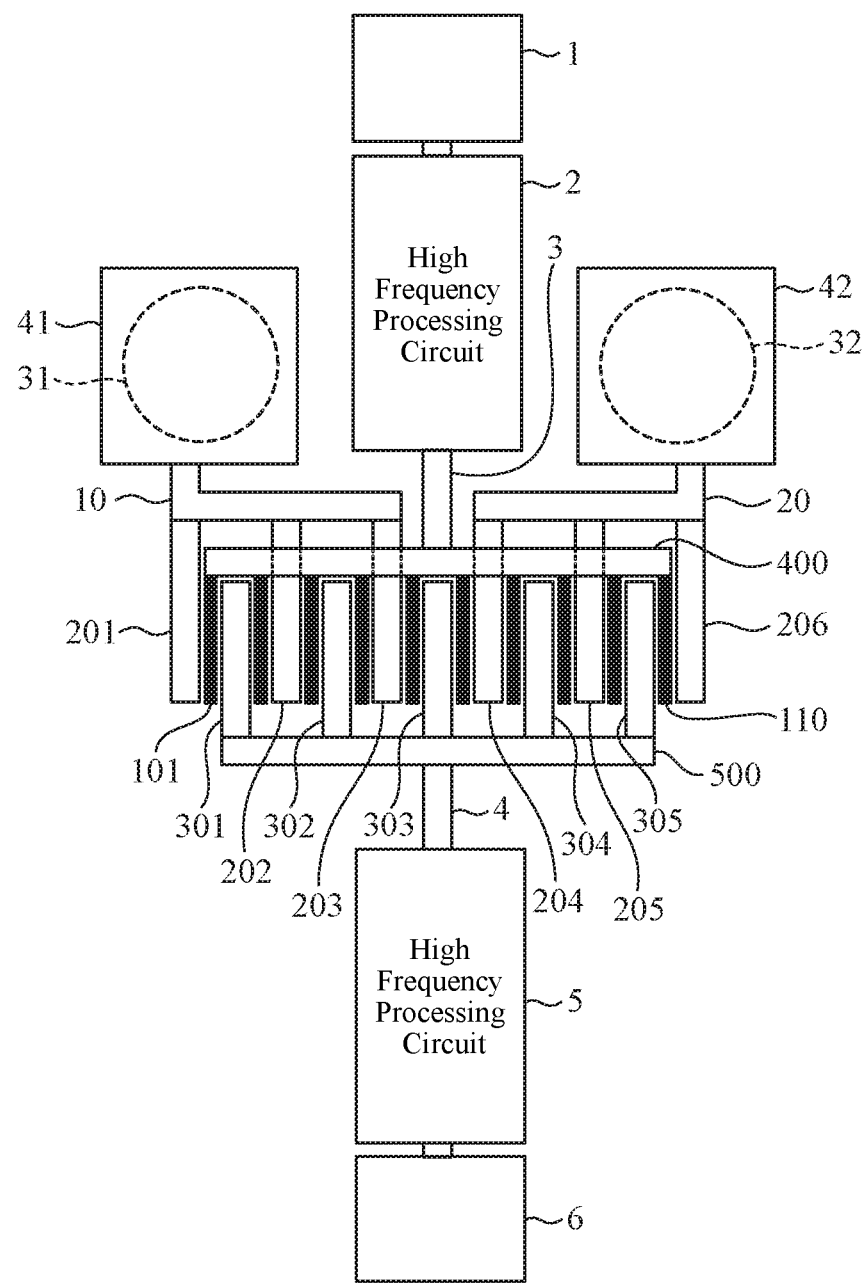
FIG. 6 is a schematic diagram of a power amplifier according to Embodiment 2 of the present invention.

FIG. 6 shows an example of the configuration of a power amplifier according to Embodiment 2.

The power amplifier according to Embodiment 2 includes a drain feeder 500, a transmission line 4, a higher harmonic processing circuit 5, and an output terminal 6, which are not shown in FIG. 1, in addition to the components shown in FIG. 1. More specifically, in Embodiment 2, in addition to the configuration according to Embodiment 1, the higher harmonic processing circuit 5 is connected to the drain feeder 500 via the transmission line 4, and drain fingers 301 to 305 are connected together by the drain feeder 500. The higher harmonic processing circuit 5 is formed to have a symmetric layout when both the ends of the drain feeder 500 are viewed from the central part of the drain feeder 500. The other components are the same as those described before, so that the corresponding components are designated by the same reference numerals, and the explanation of the components will be omitted hereafter. Further, for avoiding the complexity of the drawing, the reference numerals 11 to 13, 21 to 23, 102 to 109, and 401 to 410 are not illustrated.

In Embodiment 2, an impedance appearing when an output side is viewed from each of the drain fingers 301 to 305 can be set to a desired impedance by the higher harmonic processing circuit 5. Because the higher harmonic processing circuit 5 is formed to have a symmetric layout when both the ends of the drain feeder 500 are viewed from the central part of the drain feeder 500, the higher harmonic processing circuit 5 also has characteristics in which impedances appearing when viewed from the drain fingers 301 to 305 are symmetric when both the ends of the drain feeder 500 are viewed from the central part of the drain feeder 500.

The impedances appearing when the output side is viewed from the drain fingers 301 to 305 have phase differences occurring due to the electric length of the drain feeder 500, and have, for the drain fingers 301 to 305 attached to the drain feeder 500, characteristics that a drain finger nearer to the ends of the drain feeder 500 is more inductive than a drain finger nearer to the central part of the drain feeder 500. On the other hand, due to the lines 10 and 20, impedance is given to each of the source fingers 201 to 206 such that a source finger nearer to the central part of the drain fingers 301 to 305 is more inductive than a source finger nearer to the ends of the drain fingers 301 to 305. As a result, the electric potential differences between the drain fingers 301 to 305 and the source fingers 201 to 206 which are caused by the phase differences among the impedances of the drain fingers 301 to 305 can be made equal to one another. Namely, the phase differences between impedances appearing when ground is viewed from the source fingers 201 to 206, and the impedances appearing when the output side is viewed from the drain fingers 301 to 305 are compensated for by the lines 10 and 20 in such a way that the drain and the source are short-circuited or open at each of the drain fingers 301 to 305. As a result, the power amplifier can operate with high efficiency.

In the above example, the higher harmonic processing circuit 5 which is formed to have a symmetric layout when both the ends of the drain fingers 301 to 305 are viewed from the central part of the drain fingers 301 to 305 is attached to the central part of the drain feeder 500, and the higher harmonic processing circuit 2 which is formed to have a symmetric layout when both the ends of the gate fingers 101 to 110 are viewed from the central part of the gate fingers 101 to 110 is attached to the central part of the gate feeder 400. However, as an alternative, only the higher harmonic processing circuit 5 on the side of the drain fingers 301 to 305 can be attached to.

As explained above, the power amplifier according to Embodiment 2 includes a higher harmonic processing circuit, having a symmetric layout when both ends of the plurality of gate fingers are viewed from a central part of the plurality of gate fingers, being attached to a central part of a drain feeder connecting the plurality of drain fingers. As a result, the efficiency of the power amplifier can be improved. Namely, by providing the lines, an impedance is given to each source finger such that a source finger nearer to the central part of the drain fingers is more inductive than a source finger nearer to the ends of the drain fingers. Therefore, because the phase differences between the impedances appearing when the ground is viewed from the source fingers, and the impedances appearing when the output side is viewed from the drain fingers are compensated for by the lines in such a way that, as to the electric potential differences between the drain fingers and the source fingers, which are caused by the phase differences of the impedances among the drain fingers, the drain and the source are short-circuited or open at each of the drain fingers. As a result, a high-efficiency operation can be performed.

Embodiment 3

In Embodiments 1 and 2, configurations in which the vias and the via pads are disposed only on the gate side are explained. However, vias and via pads may be disposed also on the drain side, and this configuration will be explained below as Embodiment 3.

Figure 7:
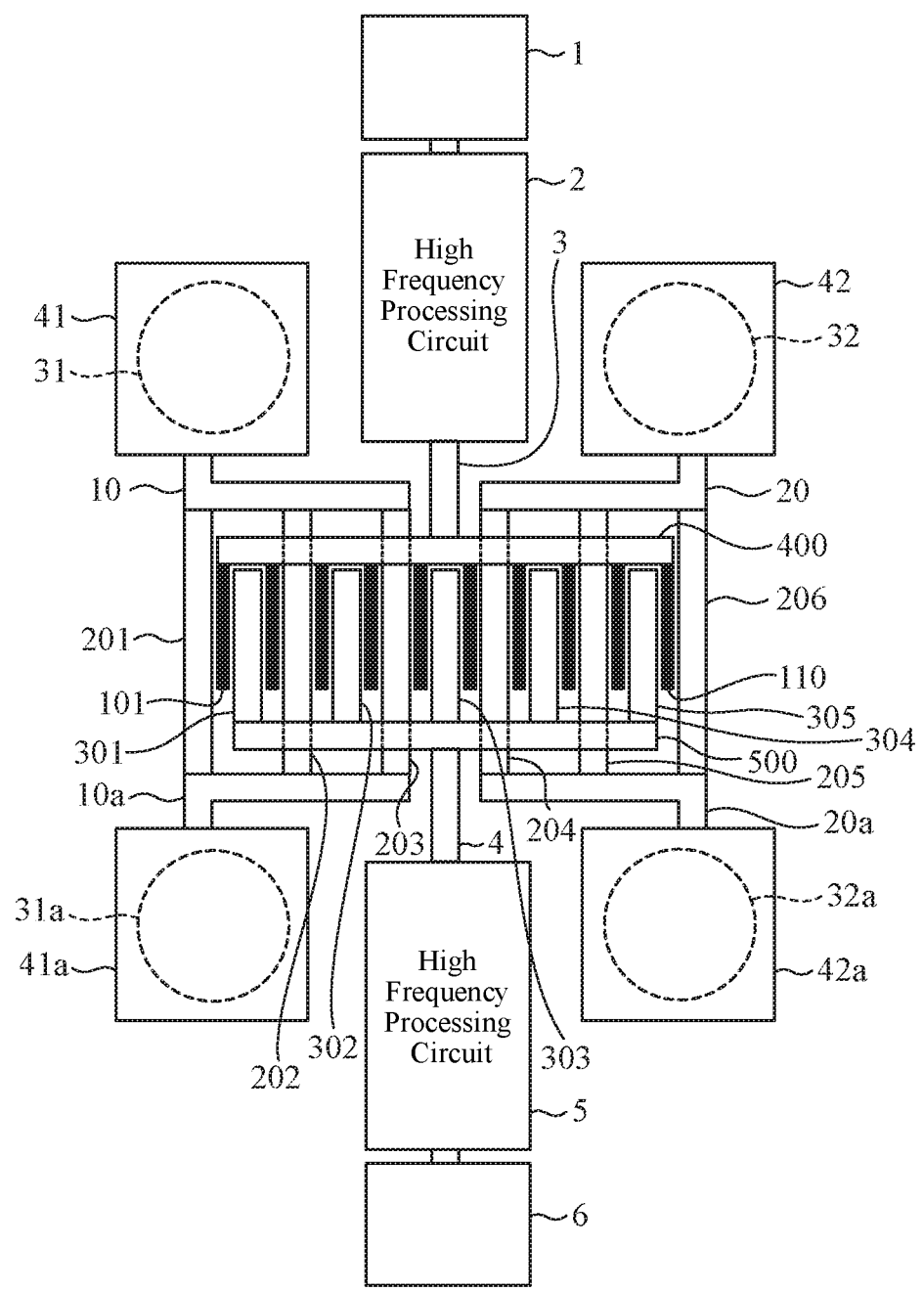
FIG. 7 is a schematic diagram of a power amplifier according to Embodiment 3 of the present invention.

FIG. 7 shows an example of the configuration of a power amplifier according to Embodiment 3. In Embodiment 3, in addition to the components according to Embodiment 2 shown in FIG. 6, vias 31a and 32a, via pads 41a and 42a, and lines 10a and 20a that connect source fingers 201 to 206 together on the drain side are included. More specifically, in Embodiment 3, the source fingers 201 to 206 are connected to the via pads 41a and 42a through the lines 10a and 20a disposed on the drain side. The vias 31a and 32a and the via pads 41a and 42a have the same configuration as the vias 31 and 32 and the via pads 41 and 42, respectively. Since the other components are the same as those according to Embodiment 2 shown in FIG. 6, the corresponding components are denoted by the same reference numerals and the explanation thereof will be omitted hereafter. Further, since the fundamental operation is the same as that according to any of Embodiments 1 and 2, the explanation of the operation will be omitted hereafter.

In the configuration shown in FIG. 7, the lines 10 and 20, the vias 31 and 32, and the via pads 41 and 42 are disposed also on the gate side. Alternatively, a configuration in which the lines 10a and 20a, the vias 31a and 32a, and the via pads 41a and 42a are disposed only on the drain side may be provided.

Further, also in Embodiment 3, the configuration in which only one of a higher harmonic processing circuit 2 and a higher harmonic processing circuit 5 is provided may be adopted.

As described above, a power amplifier according to Embodiment 3 includes a multifinger transistor which has a plurality of gate fingers, a plurality of source fingers, and a plurality of drain fingers, in which the plurality of source fingers and the plurality of drain fingers are arranged alternately, and each of the plurality of gate fingers is sandwiched between one of the plurality of source fingers and one of the plurality of drain fingers. The power amplifier includes a line attached to the plurality of source fingers in an area on a drain side and causing a phase rotation such that the nearer to a central part, being on a signal input end side, of the plurality of gate fingers a gate finger is, the more inductive the gate finger is. As a result, the efficiency of the power amplifier can be improved.

Further, the power amplifier according to Embodiment 3 includes at least one of: a higher harmonic processing circuit, having a symmetric layout when both ends of the plurality of gate fingers are viewed from a central part of the plurality of gate fingers, being attached to a central part of a gate feeder as the signal input end; and a higher harmonic processing circuit, having a symmetric layout when both ends of the plurality of drain fingers are viewed from a central part of the plurality of drain fingers, being attached to a central part of a drain feeder. The power amplifier further includes a line attached to the plurality of source fingers in an area on a gate side and causing a phase rotation such that the nearer to a central part of the plurality of gate fingers a gate finger is, the more inductive the gate finger is. As a result, the efficiency of the power amplifier can be improved. Namely, the lines for causing phase rotations such that the nearer to a central part of the plurality of gate fingers a line is, the more inductive the line is than ends part of the plurality of gate fingers. Consequently, the phase differences of the gate-to-source voltages can be compensated for by both the line on the gate side and the line on the drain side. As a result, the flexibility of the design can be improved and the efficiency of the power amplifier can be improved.

In above Embodiments 1 to 3, examples of a multifinger transistor formed by ten gate fingers (gate fingers 101 to 110) are shown. Alternatively, the same advantages are provided also in a case of a multifinger transistor formed by a plurality of gate fingers whose number is other than 10.

Further, in the above Embodiments 1 to 3, examples of a power amplifier using a transistor formed by one cell are shown. Alternatively, the same advantages can be achieved also in a case of a power amplifier in which a plurality of multifinger transistors are arranged in parallel.

It is to be understood that any combination of the above-described embodiments can be made, various changes can be made in any component according to any one of the above-described embodiments, and any component according to any one of the above-described embodiments can be omitted within the scope of the invention.

INDUSTRIAL APPLICABILITY

As described above, the present invention relates to a power amplifier that uses a multifinger transistor, and has a configuration for making the electric potential differences and the phase differences among the gate-to-source voltages at the gate fingers be equal to one another, and is suitable for use as a power amplifier which is included in a communication device or a radar device, and which amplifies the power of a transmission signal up to a desired level.

REFERENCE SIGNS LIST

1 input terminal, 2 and 5 higher harmonic processing circuit, 3 and 4 transmission line, 6 output terminal, 10 and 20 line, 31, 31a, 32, and 32a via pad, 41, 41a, 42, and 42a via pad, 101 to 110 gate finger, 201 to 206 source finger, 301 to 305 drain finger, 400 gate feeder, 401 to 410 line, and 500 drain feeder.

The invention claimed is:

1. A power amplifier comprising:
a multifinger transistor which has a plurality of gate fingers, a plurality of source fingers, and a plurality of drain fingers, in which the plurality of source fingers and the plurality of drain fingers are arranged alternately, and each of the plurality of gate fingers is sandwiched between one of the plurality of source fingers and one of the plurality of drain fingers,
wherein the power amplifier includes a line attached to the plurality of source fingers in an area on a gate side and causing a phase shift such that an inductance of a respective gate finger of the plurality of gate fingers becomes greater as a distance of the respective gate finger from a central part of the plurality of gate fingers on a signal input end side decreases,
wherein the central part of the plurality of gate fingers is on the signal input end side, and
wherein the power amplifier further includes at least one of:
a higher harmonic processing circuit, having a symmetric layout when both ends of the plurality of gate fingers are viewed from the central part of the plurality of gate fingers, being attached to a central part of a gate feeder, connecting the plurality of gate fingers, as the signal input end side; and
a higher harmonic processing circuit, having a symmetric layout when both ends of the plurality of drain fingers are viewed from a central part of the plurality of drain fingers, being attached to a central part of a drain feeder connecting the plurality of drain fingers.

2. The power amplifier according to claim 1, wherein the multifinger transistor has a symmetric layout when both ends of the gate feeder connecting the plurality of gate fingers are viewed from the central part of the gate feeder.

3. A power amplifier comprising:
a multifinger transistor which has a plurality of gate fingers, a plurality of source fingers, and a plurality of drain fingers, in which the plurality of source fingers and the plurality of drain fingers are arranged alternately, and each of the plurality of gate fingers is sandwiched between one of the plurality of source fingers and one of the plurality of drain fingers,
wherein the power amplifier includes a line attached to the plurality of source fingers in an area on a drain side and causing a phase shift such that an inductance of a respective gate finger of the plurality of gate fingers becomes greater as a distance of the respective gate finger from a central part of the plurality of gate fingers on a signal input end side decreases,
wherein the central part of the plurality of gate fingers is on the signal input end side, and
wherein the power amplifier further includes at least one of:
a higher harmonic processing circuit, having a symmetric layout when both ends of the plurality of gate fingers are viewed from a central part of the plurality of gate fingers, being attached to a central part of a gate feeder, connecting the plurality of gate fingers, as the signal input end side; and
a higher harmonic processing circuit, having a symmetric layout when both ends of the plurality of drain fingers are viewed from a central part of the plurality of drain fingers, being attached to a central part of a drain feeder connecting the plurality of drain fingers.

4. A power amplifier comprising:

a multifinger transistor which has a plurality of gate fingers, a plurality of source fingers, and a plurality of drain fingers, in which the plurality of source fingers and the plurality of drain fingers are arranged alternately, and each of the plurality of gate fingers is sandwiched between one of the plurality of source fingers and one of the plurality of drain fingers, wherein the power amplifier includes a line attached to the plurality of source fingers in an area on a drain side and causing a phase shift such that an inductance of a respective gate finger of the plurality of gate fingers becomes greater as a distance of the respective gate finger from a central part of the plurality of gate fingers on a signal input end side decreases, wherein the central part of the plurality of gate fingers is on the signal input end side, and wherein the power amplifier further includes at least one of:

a higher harmonic processing circuit, having a symmetric layout when both ends of the plurality of gate fingers are viewed from the central part of the plurality of gate fingers, being attached to a central part of a gate feeder as the signal input end side; and a higher harmonic processing circuit, having a symmetric layout when both ends of the plurality of drain fingers are viewed from a central part of the plurality of drain fingers, being attached to a central part of a drain feeder, and the power amplifier further includes a line attached to the plurality of source fingers in an area on a gate side and causing the phase shift such that the inductance of the respective gate finger of the plurality of gate fingers becomes greater as the distance of the respective gate finger from the central part of the plurality of gate fingers on the signal input end side decreases.

5. The power amplifier according to claim 1, further comprises: a plurality of multifinger transistors each of which has a configuration of the multifinger transistor is disposed in parallel.

* * * * *